United States Patent [19]

Nakamura

[11] Patent Number: 4,798,987
[45] Date of Patent: Jan. 17, 1989

[54] SURFACE ACOUSTIC WAVE GENERATOR

[75] Inventor: Kenji Nakamura, Hadano, Japan

[73] Assignee: Canon Kabushiki Kaisha, Tokyo, Japan

[21] Appl. No.: 87,410

[22] Filed: Aug. 20, 1987

[30] Foreign Application Priority Data

Aug. 25, 1986 [JP] Japan .................. 61-197378
Aug. 25, 1986 [JP] Japan .................. 61-197379
Aug. 25, 1986 [JP] Japan .................. 61-197380

[51] Int. Cl.$^4$ ............................................. H01L 41/08
[52] U.S. Cl. ............................ 310/313 R; 310/313 B; 310/313 D
[58] Field of Search ................. 310/313; 333/150–155, 333/193–196

[56] References Cited

U.S. PATENT DOCUMENTS

| | | | |
|---|---|---|---|
| 3,940,685 | 2/1976 | Ebata | 310/313 B X |
| 4,021,761 | 5/1977 | Morii | 310/313 B X |
| 4,060,833 | 11/1977 | Onyshkevych | 310/313 C X |
| 4,425,023 | 1/1984 | Matsumoto et al. | 350/96.14 |
| 4,453,016 | 6/1984 | Verber et al. | 350/96.11 |
| 4,470,661 | 9/1984 | Matsumoto | 350/96.13 |
| 4,523,803 | 6/1985 | Arao et al. | 350/96.13 |
| 4,693,548 | 9/1987 | Tsunoi | 350/96.13 |
| 4,697,115 | 9/1987 | Mitsutsuka | 310/313 R |
| 4,707,059 | 11/1987 | Ogura et al. | 350/96.13 |

Primary Examiner—Mark O. Budd
Attorney, Agent, or Firm—Fitzpatrick, Cella, Harper & Scinto

[57] ABSTRACT

A surface acoustic wave generator includes a transducer array of a plurality of surface acoustic wave transducers having different center frequencies from each other, and a variable frequency oscillator for supplying an HF signal to drive the transducer array. A distributor distributes the HF signal supplied from the oscillator to each of the transducers of the transducer array, and a device provided between each of the transducers and the distributor prevents the HF signals reflected by the transducers from returning to the distributor.

10 Claims, 6 Drawing Sheets

SURFACE ACOUSTIC WAVE GENERATOR

BACKGROUND OF THE INVENTION

1. Field of the Invention

The present invention relates to a surface acoustic wave (SAW) generator, and more particularly to a surface acoustic wave generator suitable for use in an optical wave guide type acousto-optical (AO) system.

2. Related Background Art

A requirement for an SAW transducer used as a component of an optical wave guide type AO system such as light deflector, spectrum analyzer or correlator is more and more wide band characteristics. Several methods have been known to manufacture a wideband SAW transducer. Among others, a multiple tilted SAW transducer array (MTS array) having a plurality of interdigital transducers (IDT'S) having different center frequencies arranged at different tilt angles to meet a Bragg's condition for a guided light is simple in construction and may be electrically adjusted after the preparation of the transducer. For example, U.S. Pat. No. 4,455,064 (date of patent: June 19, 1984) shows and describes such an MTS array in FIG. 1 and column 2, line 65 to column 3, line 27.

In order to excite a surface acoustic wave in an optical wave guide by such an MTS array and cause a desired AO effect with a guided wave propagating in the optical wave guide, it is necessary to apply an HF signal having specific frequency and power to each of the IDT's. Such an HF signal is usually generated and amplified by an electric circuit and supplied to the IDT's. Such an electric circuit is called an IDT driver and it is shown and described in U.S. Pat. No. 4,394,060 (date of patent July 19, 1983) in FIG. 1 and column 4, line 13 to column 5, line 50.

Figure 1:
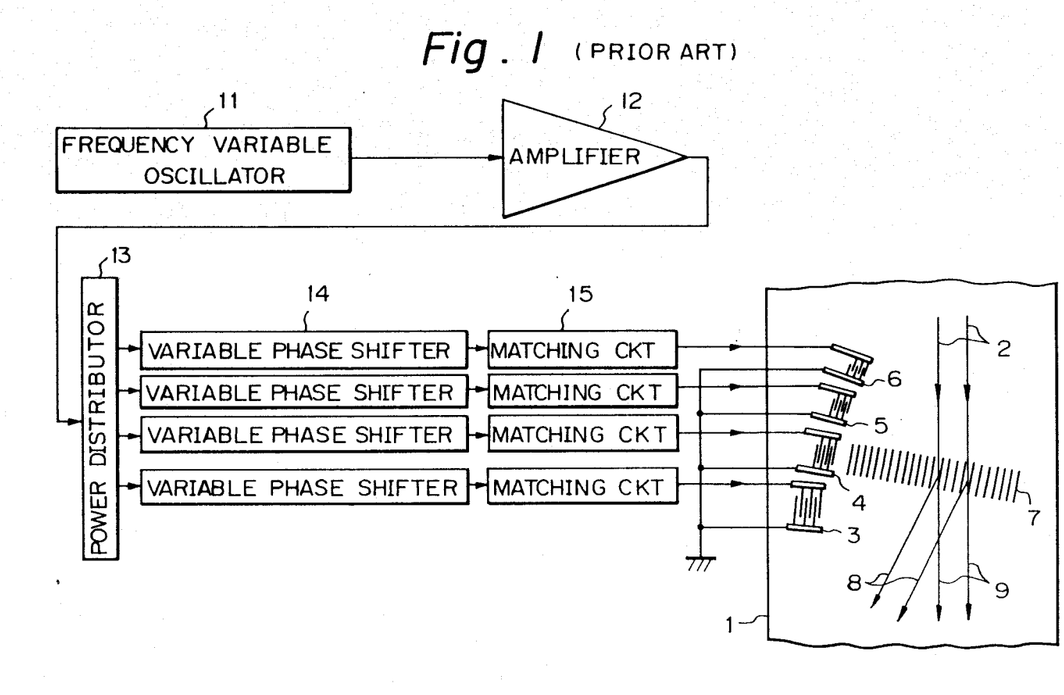
FIG. 1 shows a configuration of a prior art surface acoustic wave generator.

FIG. 1 shows a prior art surface acoustic wave generator including an IDT driver.

In FIG. 1, numeral 1 denotes an optical wave guide including a LiNbO$_3$ crystal substrate having Ti diffused on a surface thereof, and numeral 2 denotes a guided light (incident light) which propagates along the optical wave guide. Numerals 3, 4, 5 and 6 denote IDT's having different center frequencies and are arranged at different tilt angles to the guided light 2. Numeral 7 denotes an SAW which is excited from the IDT's and propagates along the optical wave guide 1, numeral 8 denotes a diffraction light generated by the diffraction of the SAW by the incident light 2, and numeral 9 denotes a non-diffraction light.

An HF signal generated by a variable frequency oscillator 11 is amplified by an amplifier 12 to a desired power and it is distributed by a power distributor 13 and supplied to the IDT's 3, 4, 5 and 6 through variable phase shifters 14 and matching circuits 15. The IDT's have different center frequencies and specific frequency band widths. Only one or at most two IDT's of the four IDT's are substantially driven to generate the SAW. In FIG. 1, the drive frequency of the transducer array is such that the SAW is excited from only the IDT 4. The SAW 7 excited by the IDT 4 acts as a diffraction grating which moves relative to the incident light, and a portion of the incident light 2 is Bragg-diffracted to form a diffraction light 8, a portion of which transmits to form a non-diffraction light 9. The diffraction light 8 is separated from the non-diffraction light 9 and used for signal processing and recording.

The variable phase shifter 14 compensates for a phase difference between the diffraction lights by the IDT's at a crossover frequency of the two adjacent IDT's to adjust the phases of the SAW's so that the SAW's from the two IDT's strengthen each other. As shown in the U.S. Pat. No. 4,455,064, the same effect may be attained without the variable phase shifters by appropriately designing the IDT arrays.

In the prior art surface acoustic wave generator, insertion losses of the variable phase shifters and matching circuits may be reduced in order to reduce a power consumption of the driver, and electrode resistances of the IDT's may be reduced and an impedance in a specific pass frequency band may be matched to a signal source for the same purpose.

However, when the electrode resistances of the IDT's are reduced and the impedance in the pass frequency band is matched to the signal source, the IDT's are of high impedance at a frequency other than the pass frequency band and the HF signal supplied to the IDT's is reflected to the signal source without substantial loss. The reflected signal passes through the matching circuits 15 and the variable phase shifters 14. Since those electrical circuits are usually passive reciprocal circuits, if the insertion losses of those circuits are reduced, the HF signals reflected from the IDT's pass without substantial loss and return to the power distributor 13 to interfere with an input signal to the distributor 13 from the amplifier 12.

For example, when the HF signal from the variable frequency generator 11 is near the center frequency of the IDT 4 as shown in FIG. 1, the HF signal is beyond the frequency bands of the IDT's 3, 5 and 6. Thus, the HF signals reflected by those IDT's return to the power distributors 13 and interfere with the input signal to the distributor 13, from the amplifier 12. Since the phase of the HF signal reflected by the IDT and returned to the power distributor 13 depends on the frequency, the frequency characteristic of the HF signal supplied to the IDT 4 includes a large ripple.

Figure 2:
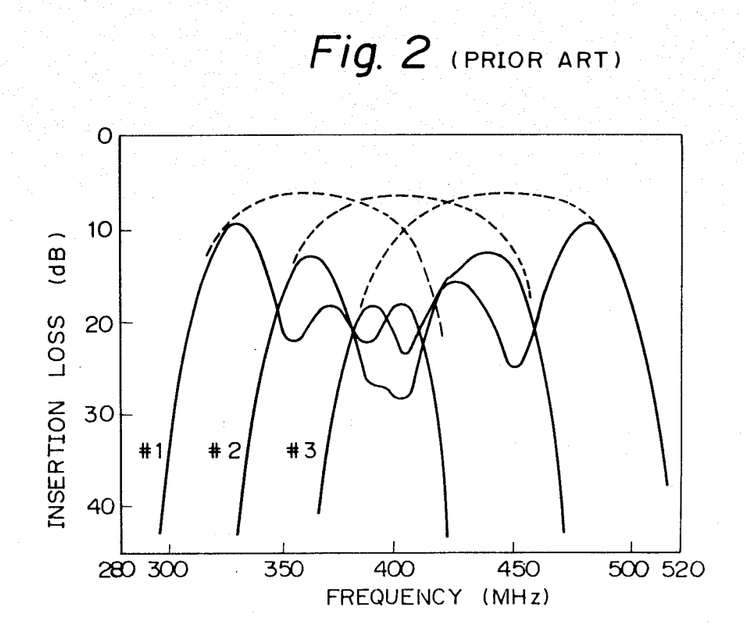
FIG. 2 shows a frequency characteristic of an insertion loss in the prior art surface acoustic wave generator.

FIG. 2 shows a graph of simulation of the ripple generation. In this simulation, the transducer comprises three IDT's, each IDT has five pairs of electrode fingers, the first IDT has a center frequency of 360 MHz, the second IDT has a center frequency of 400 MHz, the third IDT has a center frequency of 440 MHz, the IDT's are matched to a signal source 50 Ohms by inductors, and the IDT arrays are appropriately designed so that the same effect is attained without the variable phase shifter.

In FIG. 2, #1, #2 and #3 represent the first, second and third IDT's, respectively. Broken lines show results obtained when three IDT's are individually driven, and solid lines show results obtained when the three IDT's are driven in parallel. It is seen from FIG. 2 that a large ripple is created in the frequency band due to the reflected HF signals from other IDT's when the driver configuration shown in FIG. 1 is used.

When the frequency characteristic of the HF signal applied to the IDT's includes such a ripple, intensity of the SAW which serves to diffract the guided light 2 of FIG. 1 varies with the frequency. As a result, the intensity of the diffraction light 8 varies with the frequency. Accordingly, in the prior art surface acoustic wave generator shown in FIG. 1, if the loss of the circuit is to be reduced to reduce the power consumption, the intensity of the diffraction light 8 is not uniform for the change of the frequency of the HF signal used to excite the SAW 7.

SUMMARY OF THE INVENTION

It is an object of the present invention to provide a surface acoustic wave generator which resolves problems encountered in the prior art SAW generator and provides uniform intensity of a surface acoustic wave over a wide frequency range with a low power consumption.

The above object of the present invention is achieved by the surface acoustic wave generator which comprises a transducer array of a plurality of surface acoustic wave transducers having different center frequencies, a variable frequency oscillator for supplying an HF signal to drive the transducer array, a distributer for distributing the HF signal supplied from the oscillator to each of the transducers of the transducer array, and means provided between each of the transducers and the distribution circuit for preventing the HF signals reflected by the transducers from returning to the distributor.

DETAILED DESCRIPTION OF THE PREFERRED EMBODIMENTS

Figure 3:
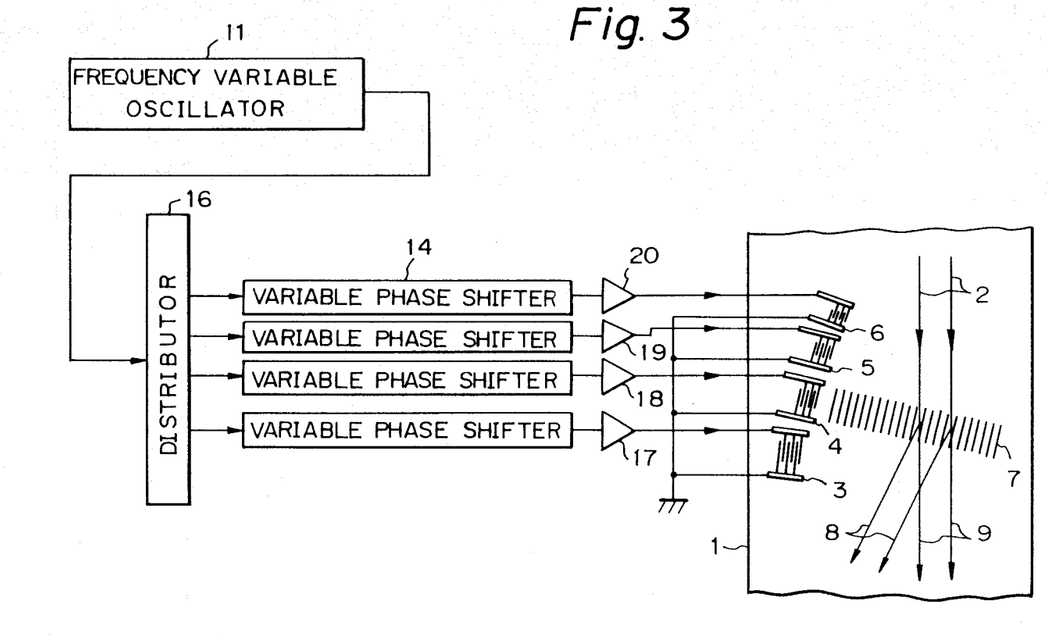
FIGS. 3 to 6 show embodiments of a surface acoustic wave generator of the present invention.

FIG. 3 shows a configuration of a first embodiment of the surface acoustic wave generator of the present invention.

In FIG. 3, numeral 1 denotes an optical wave guide made of a $LiNbO_3$ crystal substrate having Ti diffused in a surface thereof, numeral 2 denotes a guided wave (incident light) which propagates along the optical wave guide, and numeral 3, 4, 5 and 6 denote IDT's having different center frequencies and having arranged at different tilt angles to the guided light 2. Numeral 7 denotes a SAW which is excited by the IDT's and propagates along the optical wave guide 1, numeral 8 denotes a diffraction light generated by the diffraction of an incident light 2 by the SAW, numeral 9 denotes a non-diffraction light, and numerals 17, 18, 19 and 20 denote amplifiers arranged between a variable phase shifter 14 and each of the IDT's for driving the IDT's.

The HF signal generated by the variable frequency oscillator 11 is distributed by a distributor 16 and supplied to the IDT's 3–6 through the variable phase shifter 14 and the amplifiers 17–20. Since the IDT's have different center frequencies and different specific frequency band widths, only one or two at most of the four IDT's are driven to generate the SAW. In FIG. 3, like in FIG. 1, the drive frequency of the transducer array is selected such that the SAW is excited by only the IDT 4. The SAW 7 excited by the IDT 4 acts as a diffraction grating which moves relative to the incident light 2 so that a portion of the incident light 2 is Bragg-diffracted to form a diffraction light 8 and the other portion of the incident light 2 passes through as it is to form a non-diffraction light 9. The diffraction light 8 is separated from the non-diffraction light 9 for use in signal processing and recording.

In the present embodiment, when the electrode finger resistance of each of the IDT's is reduced and the impedance in the specific frequency band is matched to a signal source, the HF signals are reflected by the IDT's 3, 5 and 6 whose input HF signals are beyond the specific frequency band, and they return to the amplifiers 17, 19 and 20. In the amplifier, a rate of transmission of a signal applied to an output terminal, to an input terminal, that is, isolation may be readily designed to be approximately $-20$ dB. Accordingly, most of the HF signals reflected by the IDT's 3, 5 and 6 pass through the variable phase shifters 14 and do not return to the distributor 16, a ripple shown by a solid line in a frequency characteristic curve of FIG. 2 does not appear and the deterioration of the characteristic is substantially prevented.

Figure 4:
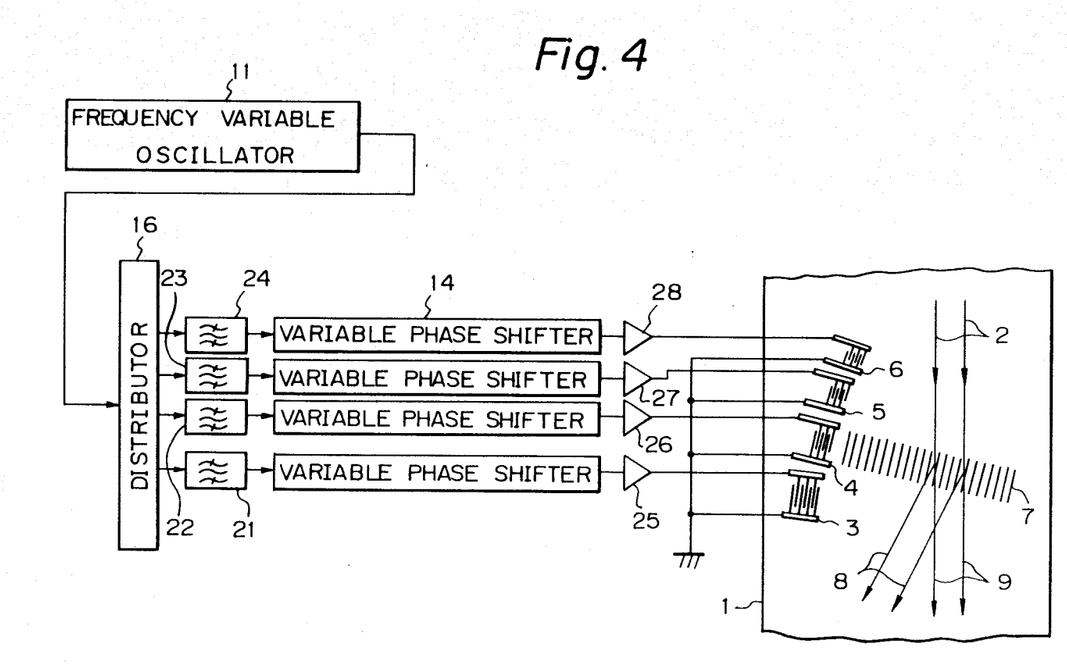

FIG. 4 shows a configuration of a second embodiment of the surface acoustic wave generator of the present invention. The like elements to those shown in FIG. 3 are designated by the like numerals and detailed description thereof is omitted.

In FIG. 4, numerals 21, 22, 23 and 24 denote band pass filters and are arranged between the distributor 16 and the variable phase shifters 14. The band pass filters can pass HF signals having band widths equal to or slightly wider than the specific pass frequency bands of the IDT's 3, 4, 5 and 6 and block other signals. When such band pass filters are used, reflection of a non-pass band signal may occur in the filters. If some increase of an insertion loss in the pass band is permitted, it is possible to prevent an incident signal of a non-pass band from being reflected from the filter to the input terminal. In the present embodiment, such filters are used.

The amplifiers 25–28 are arranged between the variable phase shifters 14 and the IDT's 3–6. The amplifiers are preferably class B or C amplifiers.

In the second embodiment, only when the HF signal generated by the variable frequency oscillator 11 is within the pass frequency band of the band pass filter, it passes through the filter and is applied to the amplifier.

Since the class B or C amplifiers do not need bias currents, the power consumption at zero signal is very low. The class B or C amplifier usually adds a harmonic component to the input signal, but since the IDT's have the specific frequency ranges, the harmonic component is not transduced to the SAW. Thus, it raises substantially no problem in the operation.

In the present embodiment, since all amplifiers for the IDT's having specific frequency bands to which the frequency of the drive HF signal does not belong are not activated, the power consumption is lower than that in the first embodiment.

Figure 5:
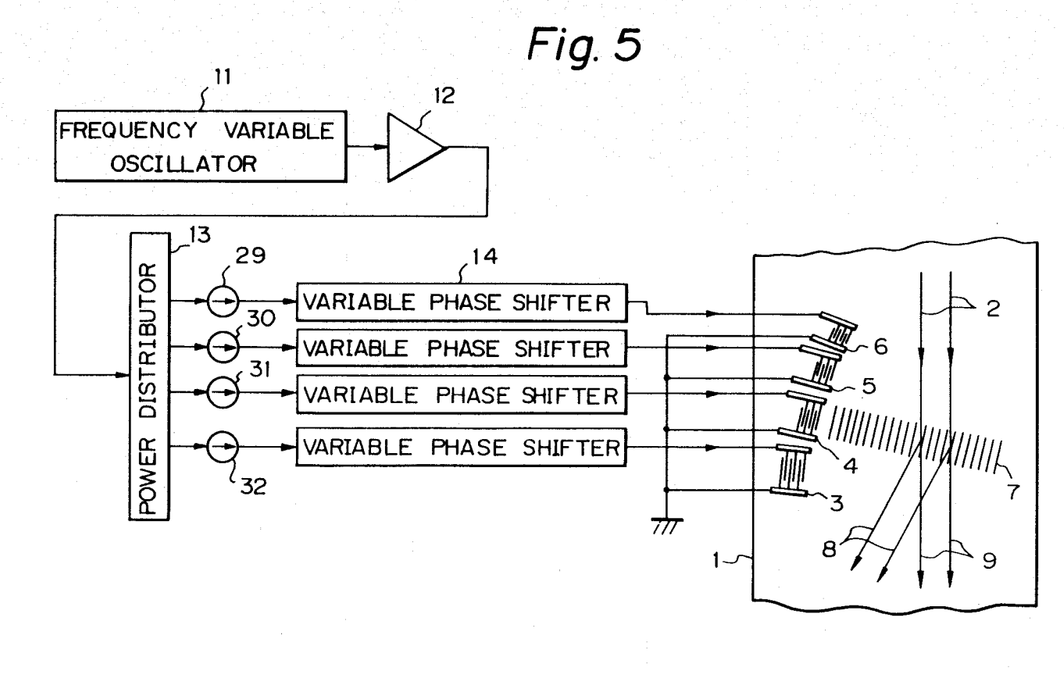

FIG. 5 shows a configuration of a third embodiment of the surface acoustic wave generator of the present invention. The like elements to those shown in FIG. 3 are designated by the like numerals and detailed explanation thereof is omitted.

In the present embodiment, a common amplifier is provided between the variable frequency oscillator 11 and the power distributor 13. Numerals 29, 30, 31 and 32 denote isolators arranged between the power distributor 13 and the variable phase shifter 14. The isolator is a two-port passive circuit element which transmits an electromagnetic wave propagating in one direction without substantial attenuation and substantially absorbs an electromagnetic wave propagating in the opposite direction. Such an isolator is described in "Electronics and Communication Handbook", edited by The Institute of Electronics and Communication Engineers of Japan, published by Ohm Co. Ltd., 1984, page 759.

The HF signal generated by the variable frequency oscillator 11 is amplified to a desired power level by the amplifier 12 and distributed by the power distributor 13 and supplied to the IDT's 3-6 through the isolators 29-32 and the variable phase shifter 14. Since the IDT's have different center frequencies and specific frequency band widths, only one or two, at most, of the four IDT's are driven to generate the SAW. In FIG. 5, like in FIG. 3, the drive frequency for the transducer array is selected such that the SAW is excited only by the IDT 4. Signals are reflected by the IDT's 3, 5 and 6 which do not excite the SAW, to the isolators 32, 30 and 29 through the variable phase shifters 14, but the isolators do not transmit the signals to the power distributor 13 but absorb them. As a result, the ripple shown by a solid line in the frequency characteristic graph of FIG. 2 does not appear and the deterioration of the characteristic is prevented.

Figure 6:
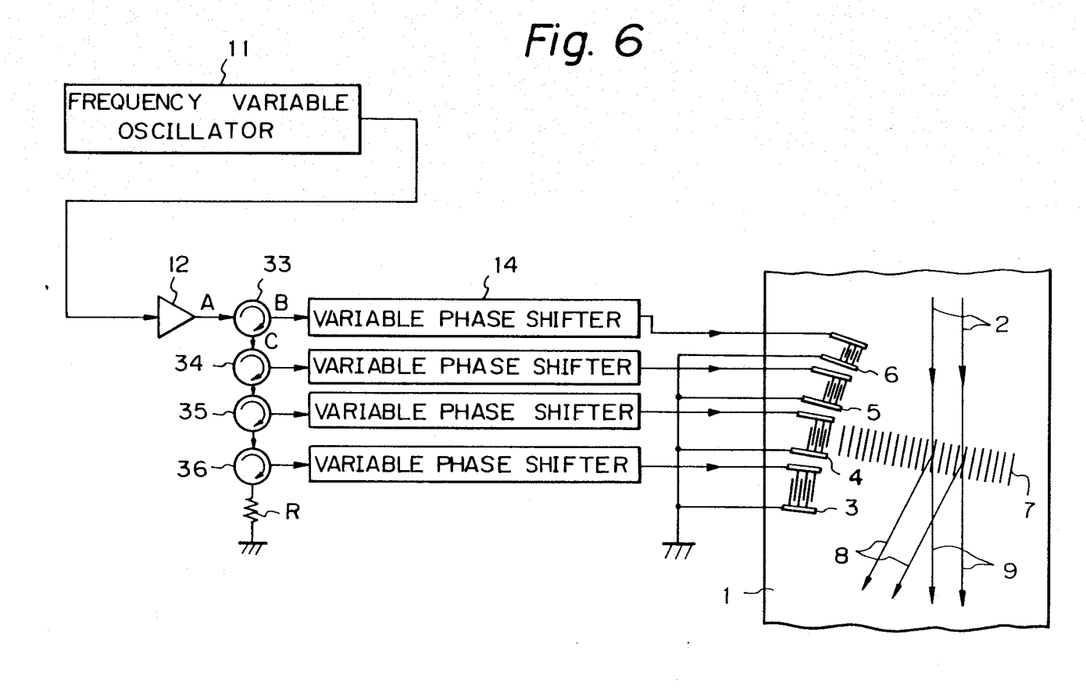

FIG. 6 shows a configuration of a fourth embodiment of the surface acoustic wave generator of the present invention. The like elements to those shown in FIG. 6 are designated by the like numerals and detailed description thereof is omitted.

In the present embodiment, the power distributor 13 and the isolators 29-32 of the embodiment of FIG. 5 are replaced by circulators 33, 34, 35 and 36. Each of the circulators is a network which has n ports (ports 1-n). When the ports other than an input port (port 1) are non-reflection ended, an input signal to the input port is transmitted to the next port 2 without substantial reflection or loss, an input signal to the port 2 is similarly transmitted to the port 3, and so on, and the input signal to the port n is transmitted to the port 1. In this manner, the signal is circulated reciprocally. (See "Electronics and Communication Handbook", page 760). In the present embodiment, the circulators 33- 36 are three-port circulators (n=3). The SAW used in the surface acoustic wave light deflector usually has a frequency of 100 to 1000 MHz and a power of less than 1W. According to the above reference, in such a frequency band, several tens of watts of power may be handled by a rump constant circulators with an insertion loss of about 0.5 dB. Accordingly, they are effectively used in the present embodiment.

The HF signal generated by the variable frequency oscillator 11 is amplified to a desired power level by the amplifier 12, and then supplied to a port A of the first circulator 33, and it is then supplied to the IDT 6 from the next port B of the circulator 33 through the variable phase shifter 14. When the input HF signal is within the specific frequency band of the IDT 6, the SAW is excited by the IDT 6, but if it is not within the band, the SAW is not excited as shown in FIG. 6. The input signal is reflected by the IDT and transmitted to the port B of the circulator 33 through the variable phase shifter 14. The signal is supplied to the second circulator 34 from the port C of the circulator 33. In the circulator 34, the signal is transmitted in the same manner as that in the circulator 33 and the input signal is supplied to the IDT 5 through the variable phase shifter 14. When the input HF signal is within the specific frequency band of the IDT 5, the SAW is excited by the IDT 5, and if it is not within the band, the SAW is not excited as shown in FIG. 6. The input signal is reflected by the IDT and transmitted to the circulator 34 through the variable phase shifter 14, and then supplied to the third circulator 35. In the circulator 35, the signal is transmitted in the same manner as that in the circulator 33 and the input signal is supplied to the IDT 4 through the variable phase shifter 14. When the input HF signal is within the specific frequency band of the IDT 4, the SAW is excited by the IDT 4 as shown in FIG. 6, but if it is not within the band, the SAW is not excited and the input signal is reflected and returns to the circulator 35 and transmitted to the fourth circulator 20. In the circulator 20, a similar operation is carried out. A resistor R is connected to the last port of the last or fourth circulator 36. The resistor serves to absorb the input HF signal when the frequency of the input HF signal is not within the specific frequency band of any one of the IDT's.

In this manner, the HF signal from the amplifier 12 is transmitted, without substantial loss, by the circulators to the IDT having the specific frequency band to which the frequency of the HF signal belongs, and it is converted to the SAW by that IDT.

In FIG. 6, like in FIG. 3, the drive frequency to the transducer array is selected such that the SAW is excited by only the IDT 4.

The present invention may be applicable to other than those shown in the embodiments. While the variable phase shifter is used in the embodiment to enhance the SAW's from the two IDT's of each other at the crossover frequency, a similar effect may be attained without such a variable phase shifter by properly arranging the IDT's as shown in U.S. Pat. No. 4,455,064. In this case, phase shifts of the amplifiers, frequency filters isolators or circulators are so designed that the diffraction lights enhance each other at the crossover frequency of the IDT.

While the transducer of the embodiment has four IDT's, the number of IDT's is not limited to four but the present invention is equally applicable to a transducer array having a plurality of IDT's.

In the embodiments of FIGS. 3 and 5, the variable phase shifter is provided between the distributor and the amplifier or isolator. Alternatively, the variable phase shifter may be provided between the amplifier or isolator and the IDT's. Similarly, in the embodiment of FIG. 4, the variable phase shifter may be provided between the distributor and the filter or between the amplifier and the IDT's.

While the IDT's and the drivers are directly coupled in the embodiment, if output impedances of the drivers are not equal to input impedances of the IDT's, matching circuits may be inserted as shown in FIG. 1 to reduce mismatch losses.

The present invention covers all of those modifications without departing from the scope of the claims.

What is claimed is:

1. A surface acoustic wave generator comprising:
    a transducer array of a plurality of surface acoustic wave transducers having different center frequencies from each other;
    a variable frequency oscillator for supplying an HF signal to drive said transducer array within a range which covers frequency bands of said transducers;
    a distributor for distributing and inputting in parallel the HF signal supplied from said oscillator to each of said transducers of said transducer array; and
    prevention means provided between each of said transducers and said distributor for preventing the HF signals reflected by said transducers from returning to said distributor.

2. A surface acoustic wave generator according to claim 1, wherein said prevention means includes a plurality of amplifiers connected to said transducers, respectively.

3. A surface acoustic wave generator according to claim 2 further comprising a plurality of band pass filters provided between each of said amplifiers and said distributors for transmitting only the HF signals each having the same band or a slightlly wider band as or than specific pass frequency band of the corresponding transducer.

4. A surface acoustic wave generator according to claim 2, wherein said amplifiers are class B or C amplifiers.

5. A surface acoustic wave generator according to claim 1, wherein said prevention means includes a plurality of isolators connected to said transducers, respectively.

6. A surface acoustic wave generator according to claim 5 further comprising an amplifier provided between said variable frequency oscillator and said distributor.

7. A surface acoustic wave generator according to claim 1 further comprising a plurality of variable phase shifters provided between each of said transducers and said distributors.

8. A surface acoustic wave generator comprising
   a transducer array of a plurality of surface acoustic wave transducers having different center frequencies from each other;
   a variable frequency oscillator for supplying an HF signal to drive said transducer array; and
   a plurality of three-port circulators arranged with regard to one for each of said transducers, each of said circulators having a first port thereof connected to the corresponding transducer and a second port thereof connected to a third port of the next succeeding circulator, and the third port of the first circulator being connected to said variable frequency oscillator and HF signal absorb means being connected to the second port of the last circulator.

9. A surface acoustic wave generator according to claim 8 further comprising a plurality of variable phase shifters provided between each of said transducers and each of said circulators.

10. A surface acoustic wave generator according to claim 8 further comprising an amplifier provided between said variable frequency oscillator and the first circulator.

* * * * *

UNITED STATES PATENT AND TRADEMARK OFFICE
CERTIFICATE OF CORRECTION

PATENT NO. : 4,798,987
DATED : January 17, 1989
INVENTOR(S) : KENJI NAKAMURA

It is certified that error appears in the above-identified patent and that said Letters Patent is hereby corrected as shown below:

Title page:

IN [56] REFERENCES CITED

U.S. PATENT DOCUMENTS, "4,453,016 6/1984 Verber et al. should read --4,453,801 6/1984 Verber et al.--.

COLUMN 1

Line 15, "wideband" should read --wide-band--.

COLUMN 3

Line 42, "numeral" should read --numerals--.
    Line 43, "having" (second occurrence) should read --being--.

COLUMN 6

Line 9, "transmitted" should read --is transmitted-- and "fourth circulator 20." should read --fourth circulator 36.--.
    Line 10, "lator 20," should read --lator 36,--.
    Line 31, "filters" should read --filters,--.

UNITED STATES PATENT AND TRADEMARK OFFICE
CERTIFICATE OF CORRECTION

PATENT NO. : 4,798,987
DATED : January 17, 1989
INVENTOR(S) : KENJI NAKAMURA

Page 2 of 2

It is certified that error appears in the above-identified patent and that said Letters Patent is hereby corrected as shown below:

COLUMN 7

Line 10, "or a slightlly wider band as or" should read --as or a slightly wider band--.

COLUMN 8

Line 3, "comprising" should read --comprising:--.

Signed and Sealed this

Twenty-sixth Day of December, 1989

Attest:

JEFFREY M. SAMUELS

Attesting Officer     Acting Commissioner of Patents and Trademarks